(12) United States Patent
Gao

(10) Patent No.: US 10,777,624 B2
(45) Date of Patent: Sep. 15, 2020

(54) DISPLAY ASSEMBLY AND MANUFACTURING METHOD THEREOF AND DISPLAY APPARATUS

(71) Applicant: Beijing Xiaomi Mobile Software Co., Ltd., Beijing (CN)

(72) Inventor: Jing Gao, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 0 days.

(21) Appl. No.: 16/220,547

(22) Filed: Dec. 14, 2018

(65) Prior Publication Data

US 2019/0237522 A1    Aug. 1, 2019

(30) Foreign Application Priority Data

Jan. 31, 2018  (CN) .......................... 2018 1 0098860

(51) Int. Cl.
| | |
|---|---|
| *G06F 3/041* | (2006.01) |
| *H01L 27/32* | (2006.01) |
| *H01L 51/52* | (2006.01) |
| *G06K 9/00* | (2006.01) |
| *G02B 5/30* | (2006.01) |

(52) U.S. Cl.
CPC ........ *H01L 27/3244* (2013.01); *G02B 5/3025* (2013.01); *G06F 3/0412* (2013.01); *G06K 9/0004* (2013.01); *G06K 9/00087* (2013.01); *H01L 27/323* (2013.01);
(Continued)

(58) Field of Classification Search
CPC .. G02B 5/3025; G06F 3/0412; G06K 9/0004; G06K 9/00087; H01L 27/3211; H01L 27/323; H01L 27/3234; H01L 27/3244; H01L 51/5256; H01L 51/5281
See application file for complete search history.

(56) References Cited

U.S. PATENT DOCUMENTS

| | | | |
|---|---|---|---|
| 2002/0076089 A1 | 6/2002 | Muramatsu et al. | |
| 2008/0007507 A1* | 1/2008 | Kim .................. | G02F 1/13338 345/92 |

(Continued)

FOREIGN PATENT DOCUMENTS

| | | |
|---|---|---|
| CN | 106056099 A | 10/2016 |
| CN | 107068726 A | 8/2017 |

(Continued)

OTHER PUBLICATIONS

Extended Search Report for European Application No. 19153345.4 from the European Patent Office, dated Jun. 28, 2019.
(Continued)

*Primary Examiner* — Insa Sadio
(74) *Attorney, Agent, or Firm* — Finnegan, Henderson, Farabow, Garrett & Dunner, L.L.P.

(57) ABSTRACT

A display assembly includes an array substrate, a package substrate adhered to the array substrate, and a photosensitive device; wherein the array substrate includes a pixel unit for emitting light to an object to be recognized on a displaying side of the display assembly; and the photosensitive device is provided on the package substrate for generating an optical signal based on received light reflected by the object to be recognized and converting the generated optical signal into an electric signal for recognizing the object to be recognized.

10 Claims, 17 Drawing Sheets

(52) U.S. Cl.
CPC ...... *H01L 27/3234* (2013.01); *H01L 51/5256* (2013.01); *H01L 27/3211* (2013.01); *H01L 51/5281* (2013.01)

(56) References Cited

U.S. PATENT DOCUMENTS

| | | |
|---|---|---|
| 2015/0268754 A1 | 9/2015 | Chang et al. |
| 2016/0079565 A1* | 3/2016 | Maindron ........... H01L 51/0017 438/28 |
| 2018/0005007 A1 | 1/2018 | Du et al. |
| 2018/0076268 A1 | 3/2018 | Wang et al. |
| 2018/0239942 A1 | 8/2018 | Xu et al. |

FOREIGN PATENT DOCUMENTS

| | | |
|---|---|---|
| CN | 107122759 A | 9/2017 |
| CN | 107133613 A | 9/2017 |
| CN | 107292215 A | 10/2017 |
| JP | 2017-194676 A | 10/2017 |
| KR | 20160059586 A | 5/2016 |
| RU | 2456660 C2 | 7/2012 |
| RU | 2469378 C1 | 12/2012 |
| RU | 2011131379 A | 2/2013 |
| RU | 2520347 C2 | 6/2014 |
| RU | 2015106920 A | 9/2016 |
| WO | WO 2017/219677 A1 | 12/2017 |
| WO | WO 2018/000824 A1 | 1/2018 |
| WO | WO 2019/148805 A1 | 8/2019 |

OTHER PUBLICATIONS

Park, Jin-Seong et al., "*Thin film encapsulation for flexible AM-OLED: a review*", Semiconductor Science and Technology, vol. 26, 2011, 8 pgs., retrieved from http://iopscience.iop.org/0268-1242/26/3/034001.

International Search Report for Application No. PCT/CN2018/100853, from the State Intellectual Property Office of China, dated Nov. 16, 2018.

Russian Office Action dated Feb. 13, 2020, in counterpart Russian Application No. 2019115473/08(029484).

* cited by examiner

DISPLAY ASSEMBLY AND MANUFACTURING METHOD THEREOF AND DISPLAY APPARATUS

CROSS-REFERENCE TO RELATED APPLICATIONS

The present application is based upon and claims priority of Chinese Application No. 201810098860.1, filed on Jan. 31, 2018, the entire contents of which are incorporated herein by reference.

TECHNICAL FIELD

The present disclosure generally relates to the field of display technology, and particularly, to a display assembly and manufacturing method thereof and a display apparatus.

BACKGROUND

Currently, the organic light-emitting diode (OLED) display apparatus plays an increasingly important role due to its advantages such as self-illumination, high contrast, thin thickness, wide viewing angle and fast response speed. Since a user may often save important personal and business information in the display apparatus, security of the display apparatus becomes particularly essential. At present, a common way to improve the security of the display apparatus is to set a password, which can be, for example, in the form of a code, a graphical item, or a combination of a code and a graphical item. However, the above-mentioned way may encounter security problems in practical applications. For example, if the password is relatively simple, it may be easy to be leaked or be broken; and if the password is too complicated, it may be hard for the user to remember it.

In the related art, various fingerprint recognition technologies have been employed in a display assembly of the display apparatus to improve the security of the display apparatus. Among those technologies, the optical fingerprint recognition method has been widely used. For example, the display assembly in which the optical fingerprint recognition method is applied to enable fingerprint recognition function, may include a visible light source and a visible light photosensitive sensor, wherein the visible light photosensitive sensor may be integrated in an array substrate of the display assembly. When the user's finger touches the surface of the display assembly, the visible light source emits visible light, and the visible light photosensitive sensor receives the light reflected by the fingerprint, generates an optical signal based on the received light, and converts the generated optical signal into an electric signal for identifying the fingerprint.

However, due to the existence of visible light photosensitive sensor that is integrated in the array substrate of the display assembly, parasitic capacitance may be generated between the visible light photosensitive sensor and wires in a display area of the array substrate, and thereby display effects of the display assembly may be degraded.

SUMMARY

The present invention provides a display assembly and manufacturing method thereof, and a display apparatus, to solve the above problem that the visible light photosensitive sensor tends to generate parasitic capacitance with the wires in the display area of the array substrate so as to affect the display effect of the display assembly. The technical solution is as follows.

According to a first aspect of the embodiments of the present disclosure, there is provided a display assembly, including: an array substrate, a package substrate adhered to the array substrate, and a photosensitive device; wherein the array substrate includes a pixel unit for emitting light to an object to be recognized on a displaying side of the display assembly; the photosensitive device is disposed on the package substrate for generating an optical signal according to received light reflected by the object to be recognized, and converting the generated optical signal into an electric signal for recognizing the object.

According to a second aspect of the embodiments of the present disclosure, there is provided a manufacturing method for a display assembly, comprising: providing a photosensitive device on a package substrate; adhering the package substrate configured with the photosensitive device to an array substrate to form a display assembly; wherein the array substrate includes a pixel unit for emitting light to an object to be recognized which is located on the displaying side of the display assembly; the photosensitive device is configured to generate an optical signal based on received light reflected by the object to be recognized, and convert the generated optical signal into an electric signal for recognizing the object.

According to a third aspect of the embodiments of the present disclosure, there is provided a display apparatus, including the display assembly described in the first aspect.

The technical solutions provided by the present disclosure may have the following beneficial effects. In the display assembly provided by the present disclosure, since the photosensitive device is disposed on the package substrate, the photosensitive device may generate an optical signal according to the received light reflected by the object to be recognized, and convert the generated optical signal into an electric signal for recognizing the object to be recognized Compared with the related art, the photosensitive device does not tend to generate parasitic capacitance with wires in the display area of the array substrate, thereby improving the display effect of the display assembly.

It should be understood that the above general description and the following description in details are merely exemplary and are not intended to be limiting.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

FIG. 1-2 is a schematic diagram of a display assembly according to one embodiment of the present disclosure.

FIG. 2-1 is a schematic diagram of a display assembly according to one embodiment of the present disclosure.

FIG. 2-2 is a schematic diagram of a display assembly according to one embodiment of the present disclosure.

FIG. 2-3 is a schematic diagram of a display assembly according to one embodiment of the present disclosure.

FIG. 2-4 is a schematic diagram of a display assembly according to one embodiment of the present disclosure.

FIG. 2-5 is a schematic diagram showing the connection between a photosensitive module and a switch module according to one embodiment of the present disclosure.

FIG. 3-1 is a schematic diagram of a display assembly according to one embodiment of the present disclosure.

FIG. 3-2 is a schematic diagram showing the connection between an invisible light photosensitive module and a switch module according to one embodiment of the present disclosure.

FIG. 4-1 is a flowchart of a manufacturing method for a display assembly according to one embodiment of the present disclosure.

FIG. 4-2 is a schematic diagram showing the configuration of a photosensitive device on a package substrate according to one embodiment of the present disclosure.

FIG. 4-3 is a schematic diagram showing the adhesion of the package substrate configured with a photosensitive device to the array substrate according to one embodiment of the present disclosure.

FIG. 5-1 is a flowchart of a manufacturing method for a display assembly according to another embodiment of the present disclosure.

FIG. 5-2 is a schematic diagram showing the formation of a first inorganic package layer according to one embodiment of the present disclosure.

FIG. 5-3 is a schematic diagram showing the formation of an organic package layer on the first inorganic package layer according to one embodiment of the present disclosure.

FIG. 5-4 is a schematic diagram showing the formation of a photosensitive device on the first inorganic package layer configured with the organic package layer according to one embodiment of the present disclosure.

FIG. 5-5 is a schematic diagram showing the formation of a second inorganic package layer on the first inorganic package layer configured with the photosensitive device according to one embodiment of the present disclosure.

FIG. 5-6 is a schematic diagram showing the adhesion of the package substrate configured with the photosensitive device to the array substrate according to one embodiment of the present disclosure.

FIG. 6-1 is a flowchart of a manufacturing method for a display assembly according to one embodiment of the present disclosure.

FIG. 6-2 is a schematic diagram showing the formation of an invisible light photosensitive device on the first inorganic package layer configured with the organic package layer according to one embodiment of the present disclosure.

FIG. 6-3 is a schematic diagram showing the formation of a visible light photosensitive device on the side of the organic package layer configured with the invisible light photosensitive device according to one embodiment of the present disclosure.

FIG. 6-4 is a schematic diagram showing the formation of a second inorganic package layer on the organic package layer configured with the invisible light photosensitive device and the visible light photosensitive device according to one embodiment of the present disclosure.

FIG. 6-5 is a schematic diagram showing the adhesion of the package substrate configured with the invisible light photosensitive device and visible light photosensitive device to the array substrate according to one embodiment of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The implementations set forth in the following description of exemplary embodiments do not represent all implementations consistent with the invention. Instead, they are merely examples of apparatuses and methods consistent with aspects related to the invention as recited in the appended claims.

Figure 1:
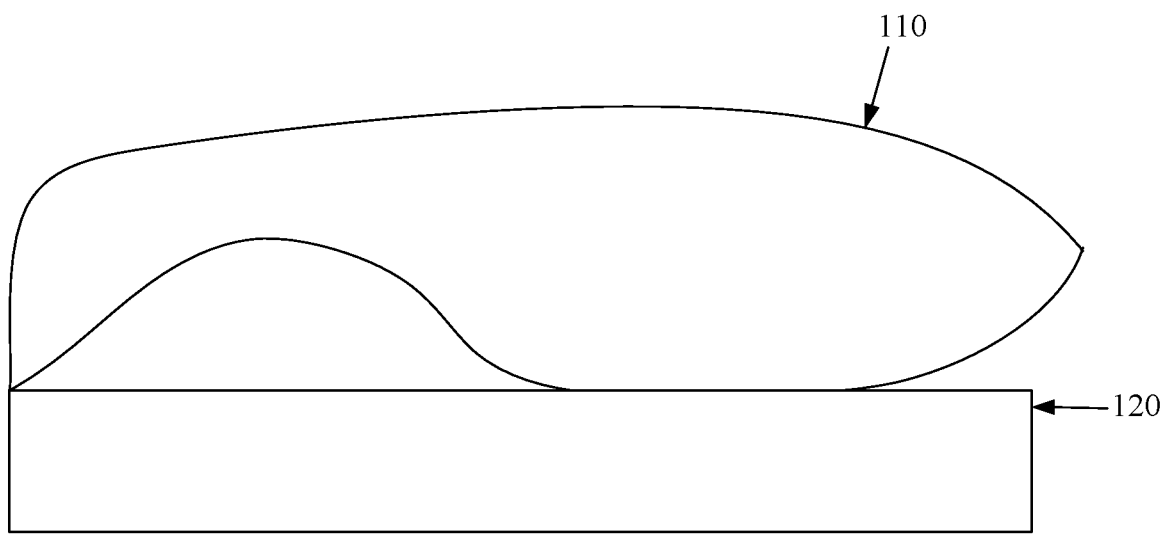
FIG. 1-1 is a schematic diagram of an application scenario for a display assembly according to one embodiment of the present disclosure.

FIG. 1-1 shows a schematic diagram of an application scenario for a display assembly according to exemplary embodiments of the present disclosure. The application scenario may include an object 110 to be recognized and a display assembly 120. The object 110 to be recognized may be a fingerprint or a palm print. The display assembly 120 can be a product or a device with display function, such as an OLED panel, an active-matrix organic light-emitting diode (AMOLED) panel, a mobile phone, a tablet computer, a television, a display, a notebook computer, a digital photo frame, and a navigation device.

Figures 1, 2:
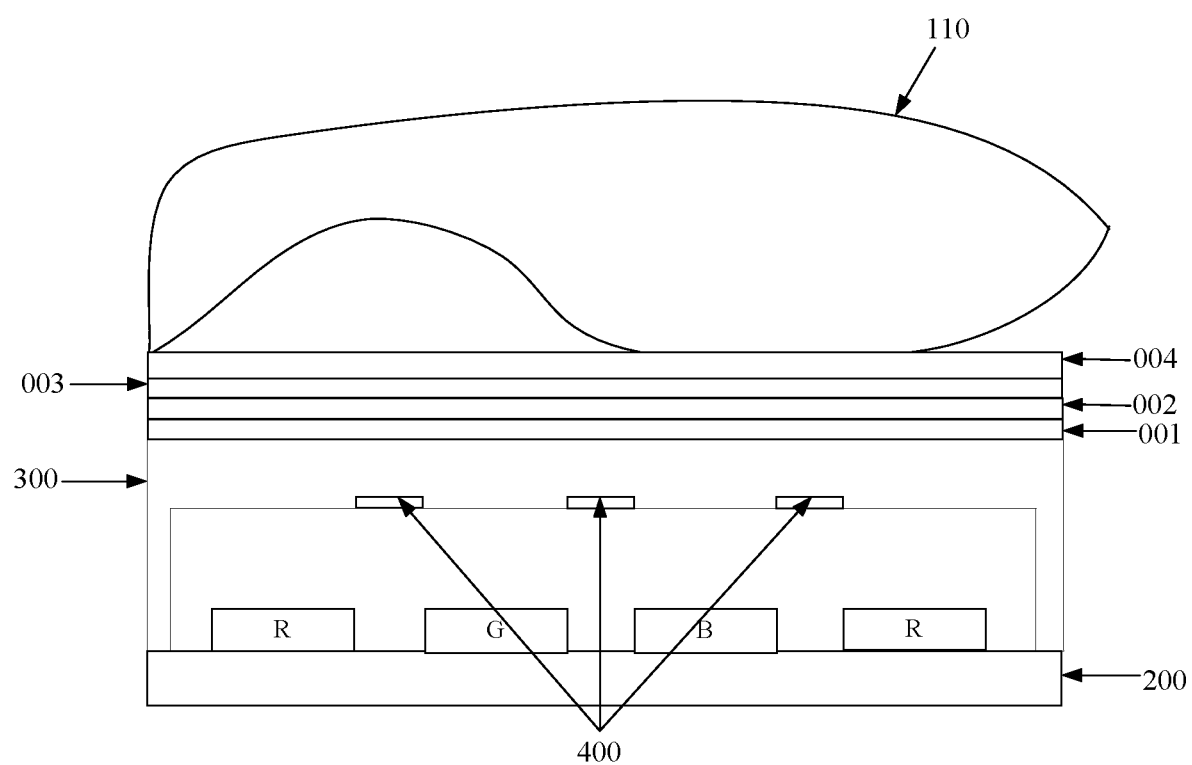

FIG. 1-2 shows a schematic diagram of a display assembly according to one embodiment of the present disclosure. As shown in FIG. 1-2, the display assembly includes: an array substrate 200, a package substrate 300 adhered to the array substrate 200, and a photosensitive device 400.

The array substrate 200 includes pixel units for emitting light to an object to be recognized which is located on the displaying side of the display assembly. For example, the object to be recognized can be a fingerprint or a palm print.

The photosensitive device 400 is disposed on the package substrate 300 for generating an optical signal according to the received light reflected by the object 110 to be recognized, and converting the generated optical signal into an electrical signal for recognizing the object 110.

As described above, in the display assembly provided by the present disclosure, since the photosensitive device is disposed on the package substrate, the photosensitive device can generate an optical signal according to the received light reflected by the object to be recognized, and convert the generated optical signal into an electric signal for recognizing the object to be recognized. Compared with the related art, the photosensitive device does not tend to generate parasitic capacitance with wires in the display area of the array substrate, thereby improving the display effect of the display assembly.

In exemplary embodiments, shown in FIG. 1-2, the display assembly also includes: a touch panel 001, a polarizer (POL) 002, an optically clear adhesive (OCA) 003, and a cover plate 004 sequentially disposed on the side of the package substrate 300 away from the array substrate 200. For the descriptions of the touch panel 001, the polarizer (POL) 002, the optically clear adhesive (OCA) 003, and the cover plate 004, reference may be made to the related art, and details are not described herein again.

In exemplary embodiments, shown in FIG. 2-1, the package substrate 300 may include a first inorganic package layer 301, an organic package layer 302, and a second inorganic package layer 303 laminated sequentially. For example, the photosensitive device 400 may be disposed between the organic package layer 302 and the second inorganic package layer 303.

In exemplary embodiments, shown in FIG. 2-2, the photosensitive device 400 may be disposed between the organic package layer 302 and the first inorganic package layer 301.

Figures 1, 2:
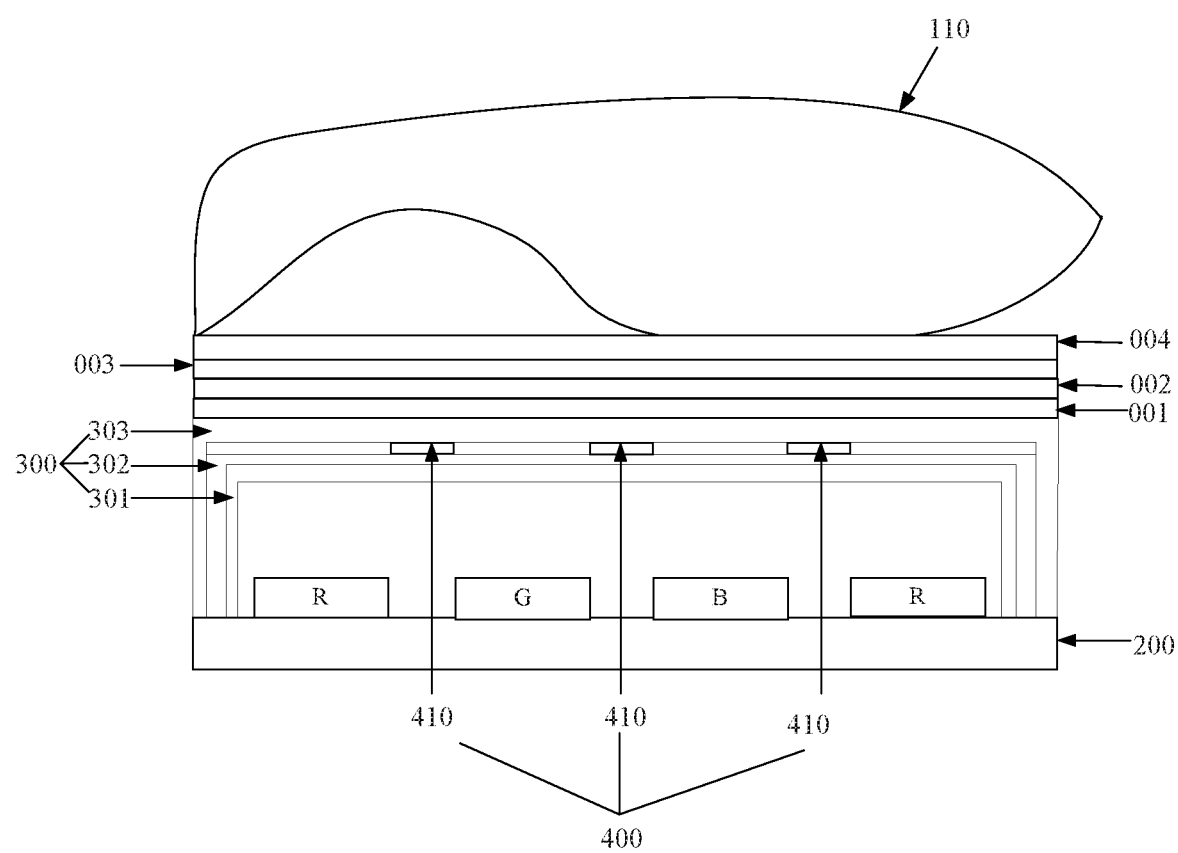
Figure 2:
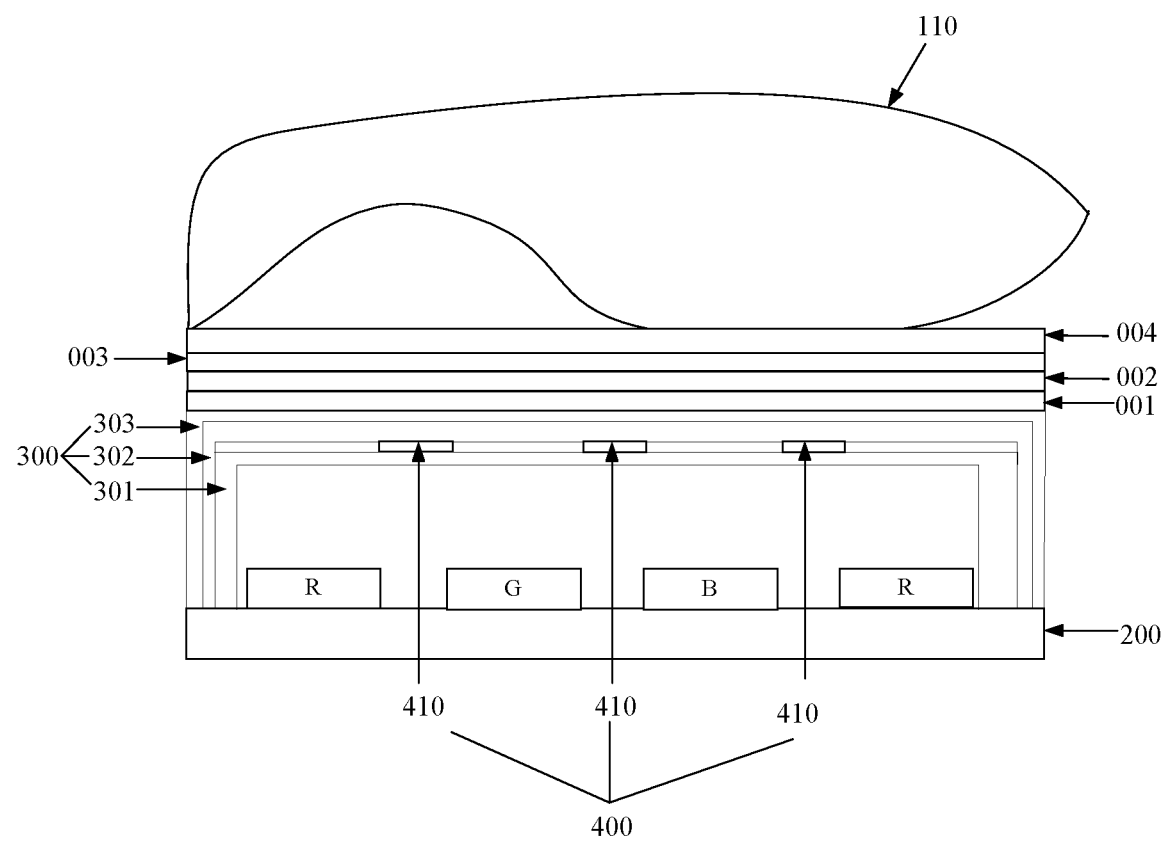
Figures 2, 3:
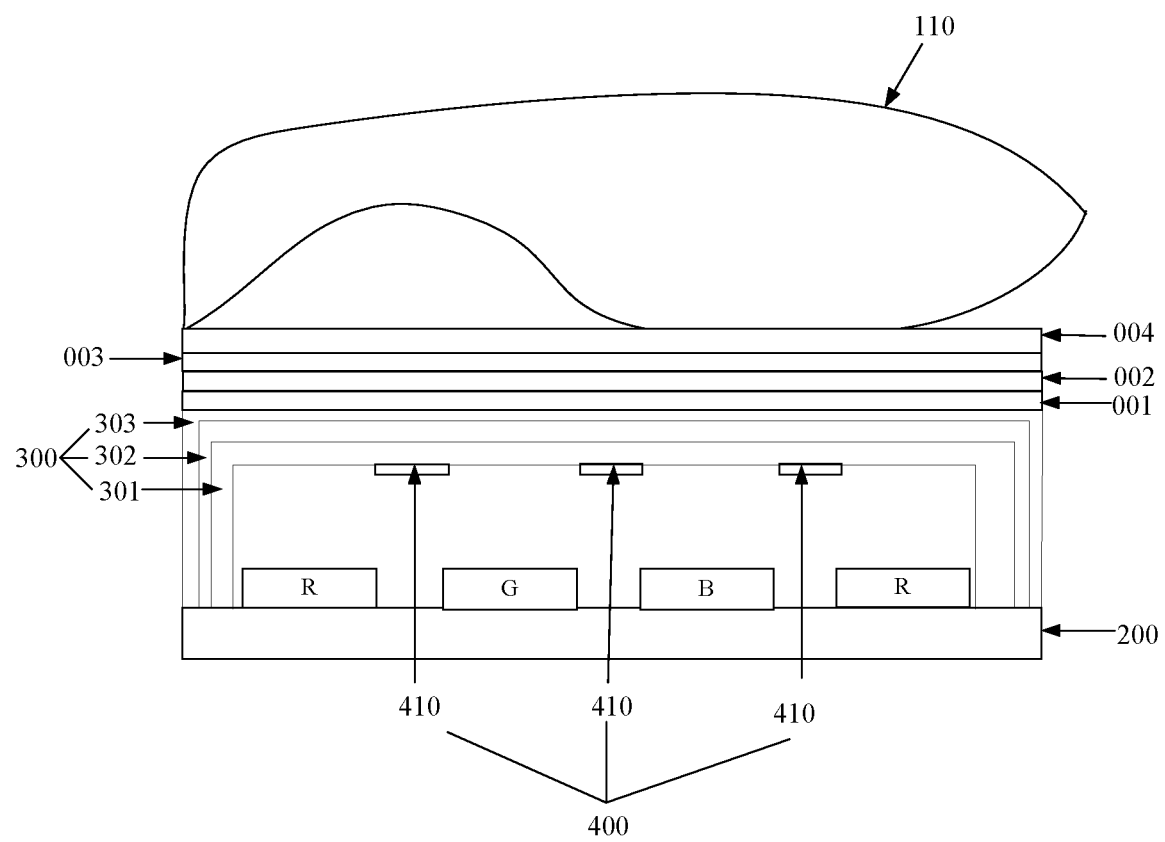

In exemplary embodiments, shown in FIG. 2-3, the photosensitive device 400 may be disposed on the side of the first inorganic package layer 301 adjacent to the array substrate 200.

Figures 2, 3, 4:
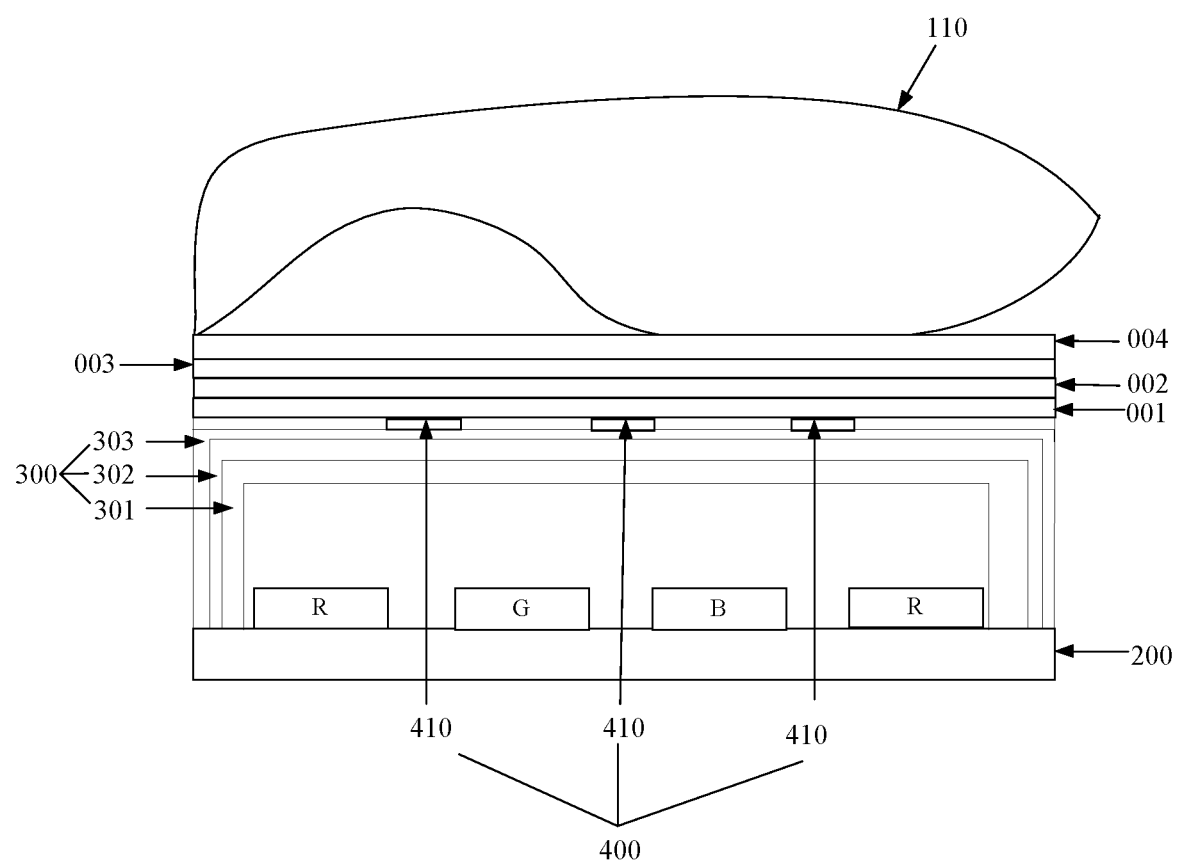

In exemplary embodiments, shown in FIG. 2-4, the photosensitive device 400 may be disposed on the side of the second inorganic package layer 303 adjacent to the touch panel 001.

In exemplary embodiments, the pixel unit includes a plurality of pixels arranged in a matrix, each of which includes at least two sub-pixels. For example, as shown in FIG. 2-1, each pixel may include three sub-pixels, that is, red sub-pixel (R), blue sub-pixel (B), and green sub-pixel (G). As shown in FIG. 2-1 to FIG. 2-4, the photosensitive device 400 may include a plurality of photosensitive modules 410, and the orthographic projection of each photosensitive module 410 on the array substrate 200 is located in the space between two sub-pixels, thereby avoiding the display effect of the display assembly affected by the photosensitive module.

If each pixel includes a red sub-pixel, the red sub-pixel may be used for emitting light to the object to be recognized.

In practical applications, each photosensitive module included in the photosensitive device may be connected with a switch module. The photosensitive module is used to output the electric signal converted for recognizing the object to be recognized when the switch module is turned on. FIG. 2-5 illustrates the connection of a photosensitive module 410 and a switch module 210. As shown in FIG. 2-5, the switch module 210 is electrically connected with a scan line 211, a read line 212 and the photosensitive module 410, respectively. The switch module 210 is configured to be opened under the control of the scan line 211, and the photosensitive module 410 is configured to output the converted electrical signal through the read line 212 when the switch module 210 is turned on, for example, output to a signal processing device, thereby allowing the signal processing device to recognize the object to be recognized based on the electrical signal. In FIG. 2-5, VL indicates a low electrical level and VH indicates a high electrical level. For example, assume that the object to be recognized is a fingerprint, which is composed of a series of fingerprint ridges and fingerprint valleys on the skin surface of the finger tip, the photosensitive device 400 generates an optical signal according to the received light reflected by the fingerprint, and converts the generated optical signal into an electric signal for recognizing the fingerprint, and then outputs the electric signal to the signal processing device. The signal processing device determines the positions of the fingerprint ridges and the fingerprint valleys based on the electric signal, and then determines the fingerprint texture based on the positions. Subsequently, the fingerprint texture is compared with those stored in the fingerprint database, and if it is identical with one, the fingerprint is recognized successfully.

The switch module 210 as described above is a thin film transistor. The gate of the thin film transistor is connected to the scan line 211, the first electrode of the thin film transistor is connected to the read line 212, and the second electrode of the thin film transistor is connected to the photosensitive module 410.

In exemplary embodiments, the photosensitive device 400 comprises at least one of a visible light photosensitive device and an invisible light photosensitive device. That is, the photosensitive device 400 can be either a visible light photosensitive device or an invisible light photosensitive device, or can include both a visible light photosensitive device and an invisible sensitive device, which is not limited in this embodiment of the present invention.

In the present disclosure, since the photosensitive device is disposed on the package substrate, the photosensitive device may generate an optical signal according to the received light reflected by the object to be recognized, and convert the generated optical signal into an electric signal for recognizing the object to be recognized. Compared with the related art, the photosensitive device does not tend to generate parasitic capacitance with wires in the display area of the array substrate, thereby improving the display effect of the display assembly.

FIG. 3-1 shows a schematic diagram of a display assembly according to another embodiment of the present disclosure. As shown in FIG. 3-1, the display assembly includes: an array substrate 200, a package substrate 300 adhered to the array substrate 200, and a photosensitive device, wherein the photosensitive device includes an invisible light photosensitive device 420 and a visible light photosensitive device 430.

The array substrate 200 includes a pixel unit for emitting invisible light and visible light to an object 110 to be recognized which is located on the displaying side of the display assembly. For example, the invisible light can be infrared light to avoid the damage to the user's vision.

The invisible light photosensitive device 420 is disposed on the package substrate 300 for generating a first optical signal according to the received invisible light reflected by the object 110 to be recognized, and converting the generated first optical signal into a first electric signal for recognizing the object 110 to be recognized. For example, the invisible light photosensitive device is an infrared photosensitive sensor when the invisible light is infrared light.

The visible light photosensitive device 430 is disposed on the package substrate 300, and the orthographic projections of the visible light photosensitive device 430 and the invisible light photosensitive device 420 on the array substrate 200 do not overlap. The visible light photosensitive device 430 is used for generating a second optical signal based on the received visible light reflected by the object 110 to be recognized, and converting the generated second optical light into a second electric signal for recognizing the object 110 to be recognized.

Since the invisible light emitted by the pixel unit to the object to be recognized on the displaying side of the display assembly is susceptible to the external environment, the recognition accuracy may be lowered. According to this embodiment of the present disclosure, the pixel unit can emit both invisible light and visible light to the object to be recognized on the displaying side of the display assembly. Therefore, the visible light photosensitive device also may generate a second optical signal based on the received visible light reflected by the object to be recognized, and convert the generated second optical signal into a second electric signal for recognizing the object to be recognized, and accordingly the recognition accuracy can be improved.

As shown in FIG. 3-1, the package substrate 300 may include a first inorganic package layer 301, an organic package layer 302 and a second inorganic package layer 303 laminated sequentially, and the invisible light photosensitive device 420 may be disposed between the organic package layer 302 and the second inorganic package layer 303.

The visible light photosensitive device 430 may be disposed between the organic package layer 302 and the second inorganic package layer 303, and the orthographic projections of the visible light photosensitive device 430 and the invisible light photosensitive device 420 on the array substrate 200 may not overlap.

Further, the pixel unit includes a plurality of pixels arranged in a matrix, each of which includes at least two sub-pixels. For example, each pixel can include three sub-pixels, that is, R sub-pixel, B sub-pixel, and G sub-pixel.

In order to prevent the orthographic projections of the visible light photosensitive device and the invisible photosensitive device on the array substrate from overlapping each other, the visible light photosensitive device and the invisible photosensitive device may be arranged alternately. For example, as shown in FIG. 3-1, the invisible light photosensitive device 420 includes a plurality of invisible light photosensitive modules 421, and the orthographic projection of each invisible light photosensitive module 421 on the array substrate 200 is located in the space between the two sub-pixels. The visible light photosensitive device 430 includes a plurality of visible light photosensitive modules 431, and the orthographic projection of each visible light photosensitive module 431 on the array substrate 200 is located in the space between the two sub-pixels. The invisible light photosensitive module 421 and the visible light photosensitive module 431 are arranged alternately. In addition, the orthographic projections of the invisible light photosensitive module 421 and the visible light photosensitive module 431 on the array substrate are located in the space between the two sub-pixels, so that the display effect of the display apparatus may not be affected by the photosensitive device.

When each pixel includes a red sub-pixel, the red sub-pixel may be used for emitting invisible light and visible light to the object to be recognized. For example, the red sub-pixel may be produced by combining 8-hydroxyquinoline aluminum and 8-hydroxyquinoline erbium.

In practical applications, each invisible light photosensitive module included in the invisible photosensitive device may be connected with a switch module. The invisible light photosensitive module is used to output the first electric signal converted for recognizing the object to be recognized when the switch module is turned on. As shown in FIG. 3-2, the invisible light photosensitive module 421 is connected with a switch module 210, and the invisible light photosensitive module 421 outputs the first electric signal converted for recognizing the object to be recognized when the switch module 210 is turned on. The switch module 210 is electrically connected with the scan line 211, the read line 212 and the invisible light photosensitive module 421, respectively. The switch module 210 is configured to be opened under the control of the scan line 211, and the invisible light photosensitive module 421 is configured to output the converted first electric signal through the read line 212 when the switch module 210 is turned on. In FIG. 3-2, VL indicates a low electrical level and VH indicates a high electrical level.

Similarly, each visible light photosensitive module may be connected with a switch module, and the visible light photosensitive module outputs the second electric signal converted for recognizing the object to be recognized when the switch module is turned on. The switch module is electrically connected with the scan line, the read line and the visible light photosensitive module, respectively. The switch module is configured to be opened under the control of the scan line, and the visible light photosensitive module is configured to output the converted second electric signal through the read line when the switch module is turned on.

In exemplary embodiments, shown in FIG. 3-1, the display assembly also includes a touch panel 001, POL 002, OCA 003, and a cover plate 004 sequentially disposed on the side of the package substrate 300 away from the array substrate 200.

In the present disclosure, since the invisible light photosensitive device and the visible light photosensitive device are disposed on the package substrate, the invisible light photosensitive device may generate the first optical signal based on the received invisible light reflected by the object to be recognized, and convert the generated first optical signal into the first electric signal for recognizing the object to be recognized. At the same time, the visible light photosensitive device may generate the second optical signal based on the received visible light reflected by the object to be recognized, and convert the generated second optical signal into the second electric signal for recognizing the object to be recognized Compared with the related art, the invisible light photosensitive device and the visible light photosensitive device do not tend to generate parasitic capacitance with wires in the display area of the array substrate, thereby improving the display effect of the display assembly. Additionally, since invisible light is susceptible to the external environment, the recognition accuracy can be improved by emitting visible light through the pixel unit disposed on the array substrate.

FIG. 4-1 shows a flow chart of a manufacturing method for a display assembly according to an embodiment of the present disclosure. As shown in FIG. 4-1, the method includes steps 401 and 402.

In step 401, a photosensitive device is provided on a package substrate.

As shown in FIG. 4-2, a photosensitive device 400 is provided on a package substrate 300, for example, by one-time patterning process, which may include the steps of photoresist coating, exposure, development, etching, and photoresist stripping.

In step 402, the package substrate configured with the photosensitive device is adhered to the array substrate to form the display assembly.

As shown in FIG. 4-3, the package substrate 300 configured with the photosensitive device 400 is adhered to the array substrate 200 to form the display assembly.

In FIG. 4-3, the array substrate 200 includes a pixel unit for emitting light to the object to be recognized on the displaying side of the display assembly. The photosensitive device 400 is used for generating an optical signal based on the received light reflected by the object to be recognized and converting the generated signal into an electric signal for recognizing the object to be recognized.

In the present disclosure, the photosensitive device, which is disposed on the package substrate, may generate an optical signal based on the received light reflected by the object to be recognized and convert the generated optical signal into an electric signal for recognizing the object to be recognized Compared with the related art, the photosensitive device does not tend to generate parasitic capacitance with wires in the display area of the array substrate, thereby improving the display effect of the display assembly.

Figures 2, 3, 4, 5:
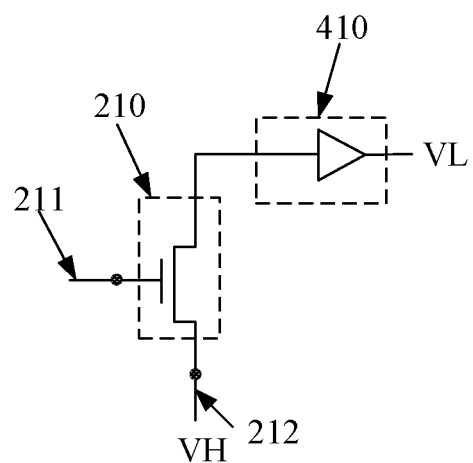
Figures 1, 3:
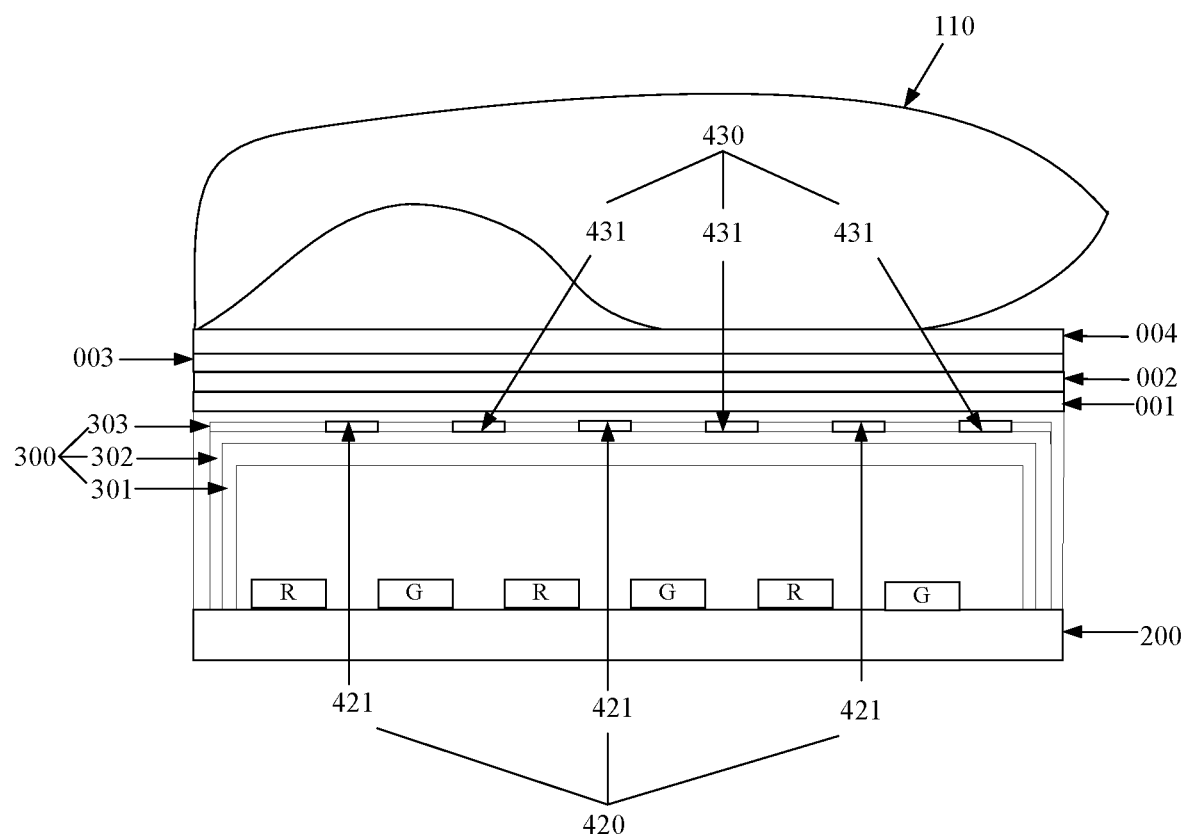
Figures 2, 3:
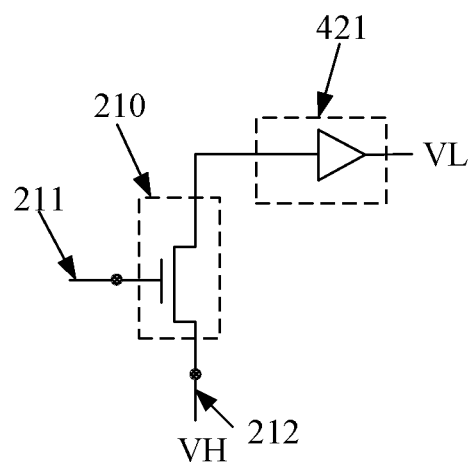
Figures 1, 4:
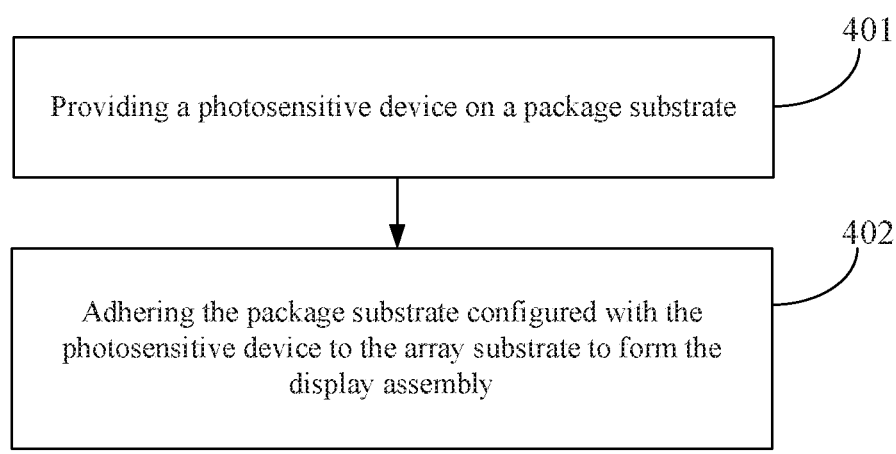
Figures 2, 4:
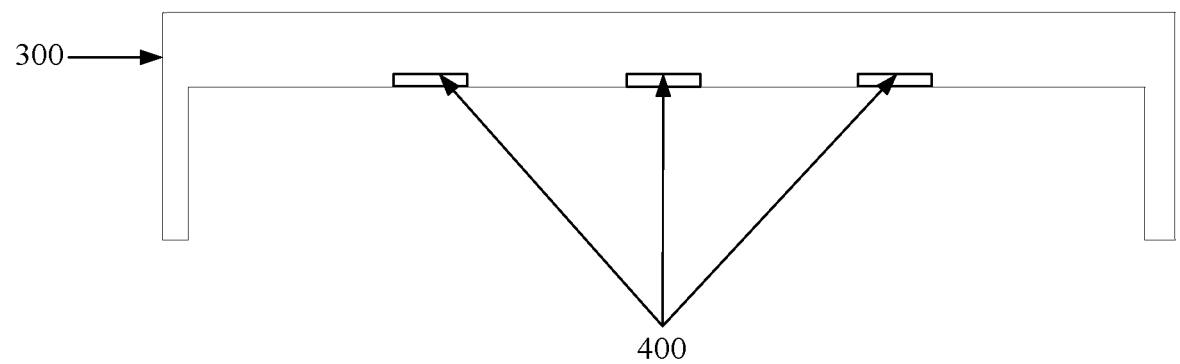
Figures 3, 4:
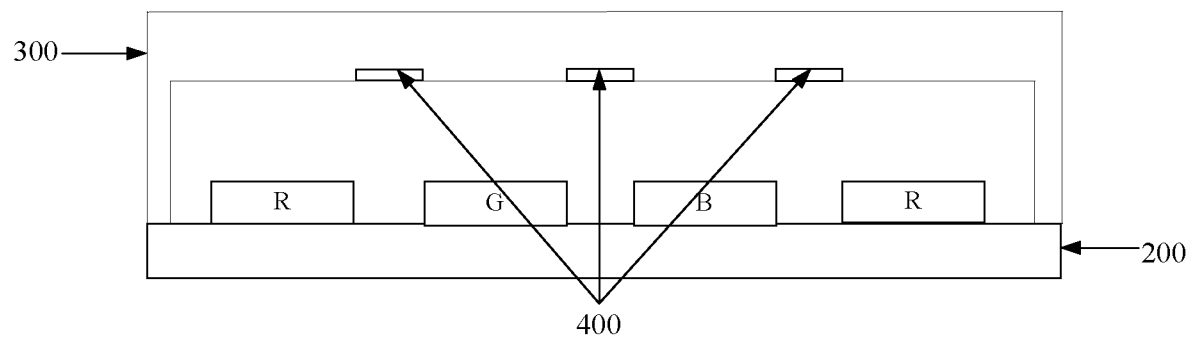

FIG. 5-1 shows a flow chart of a manufacturing method for a display assembly according to an embodiment of the present disclosure. As shown in FIG. 5-1, the method includes steps 501-506.

In step 501, a first inorganic package layer is formed.

As shown in FIG. 5-2, the first inorganic package layer 301 is formed. In some embodiments, traditional technologies may be used to implement the process of forming the first inorganic package layer.

In step 502, an organic package layer is formed on the first inorganic package layer.

As shown in FIG. 5-3, the organic package layer 302 is formed on the first inorganic package layer 301. In some embodiments, traditional technologies may be used to implement the process of forming the organic package layer.

In step 503, a photosensitive device is formed on the first inorganic package layer formed with the organic package layer.

As shown in FIG. 5-4, the photosensitive device 400 is formed on the first inorganic package layer 301 formed with the organic package layer 302, for example, by one-time patterning process.

In step 504, a second inorganic package layer is formed on the first inorganic package layer formed with the photosensitive device.

As shown in FIG. 5-5, the second inorganic package layer 303 is formed on the first inorganic package layer 301 formed with the photosensitive device 400. In some embodiments, traditional technologies may be used to implement the process of forming the second inorganic package layer.

In step 505, the package substrate configured with the photosensitive device is adhered to the array substrate to form the display assembly.

Figures 1, 5:
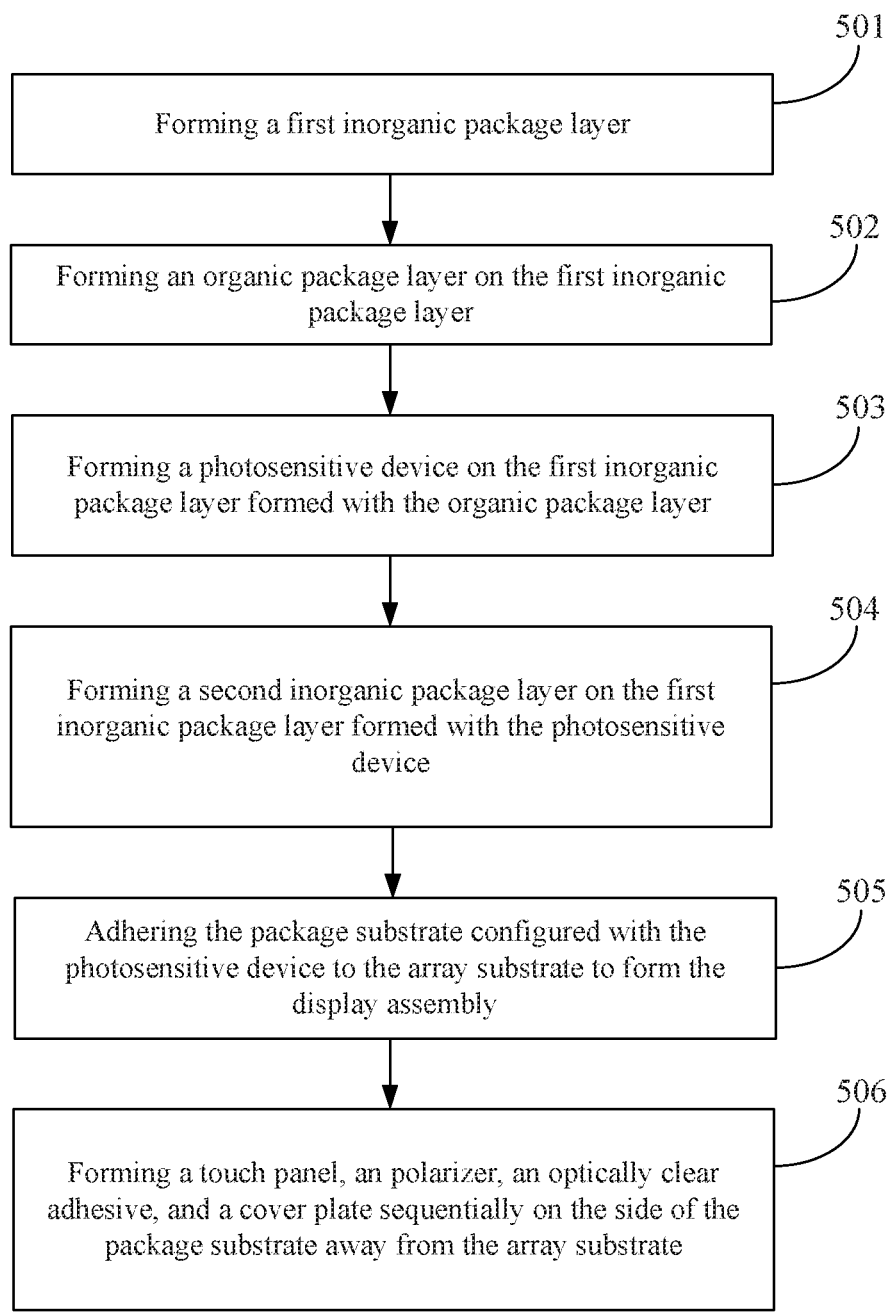
Figures 2, 5:
Figures 3, 5:
Figures 4, 5:
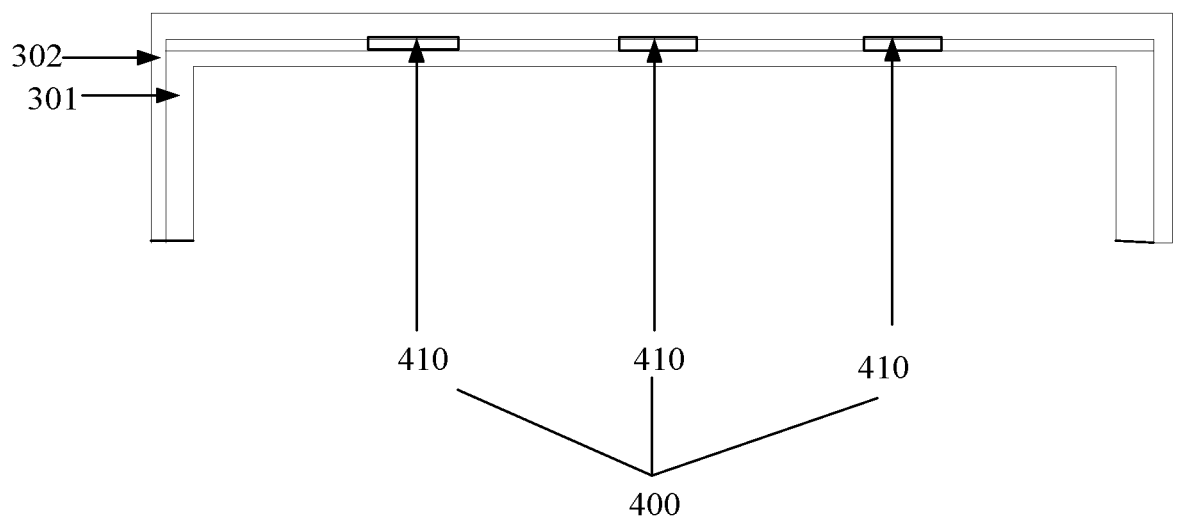
Figure 5:
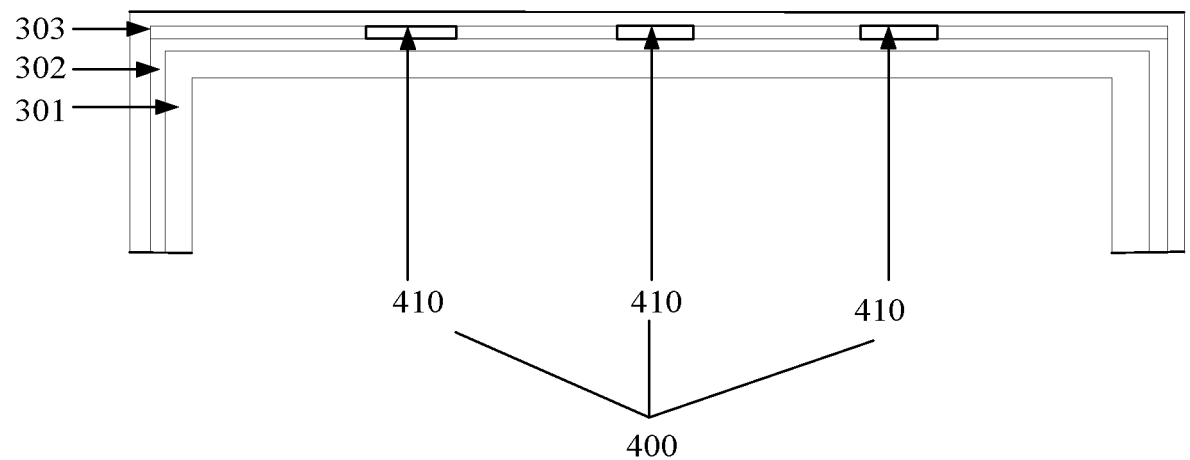
Figures 5, 6:
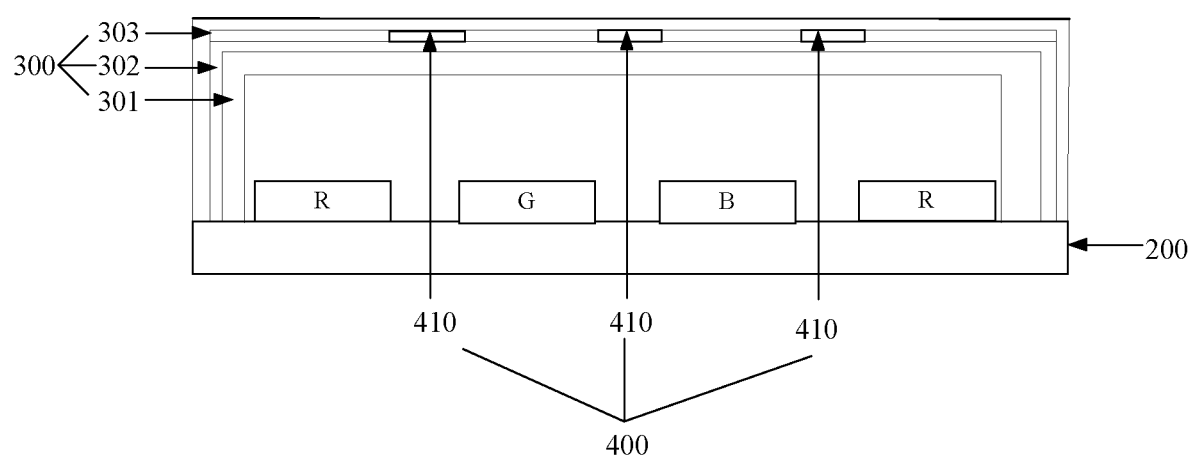
Figures 1, 6:
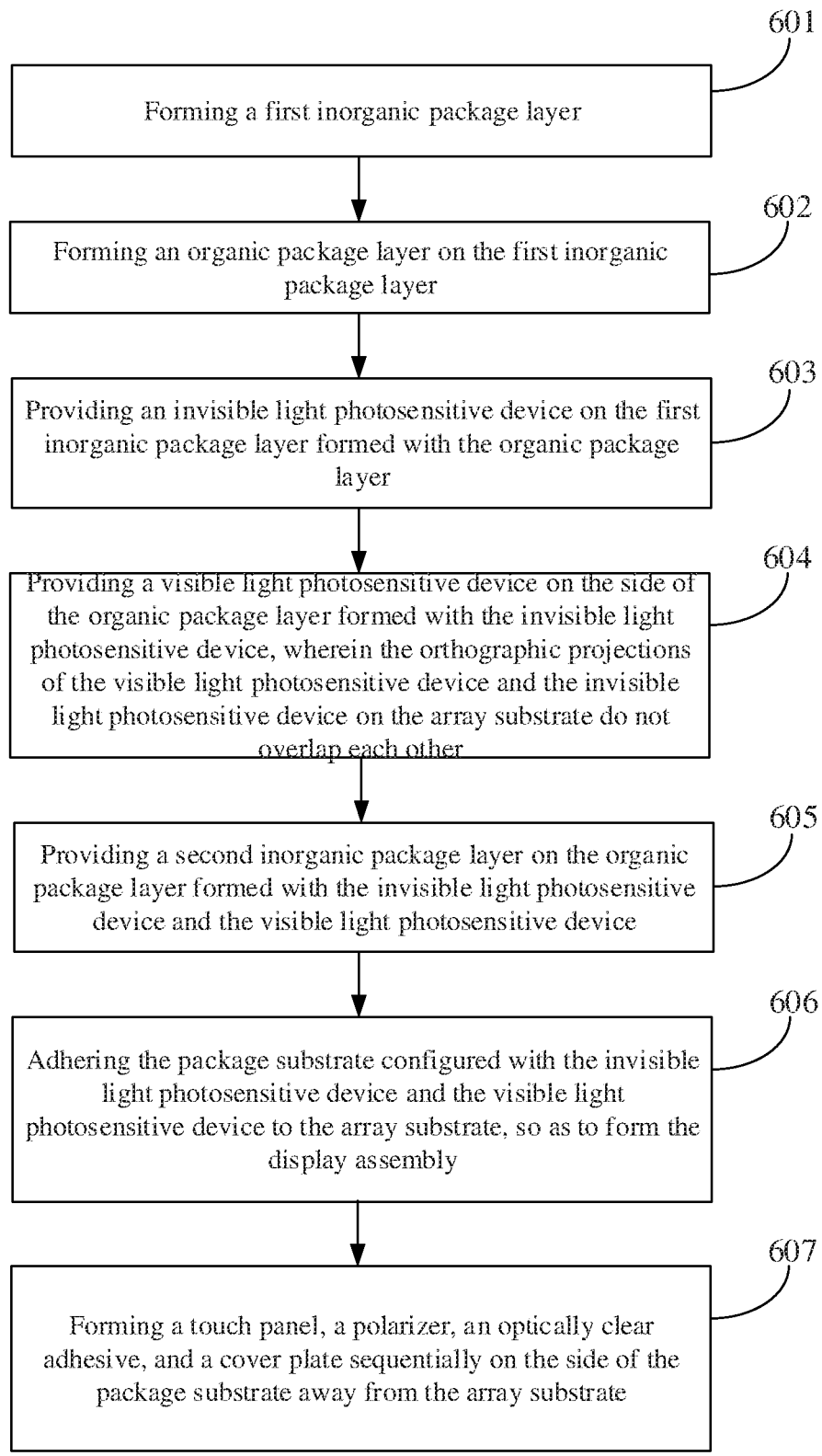
Figures 2, 6:
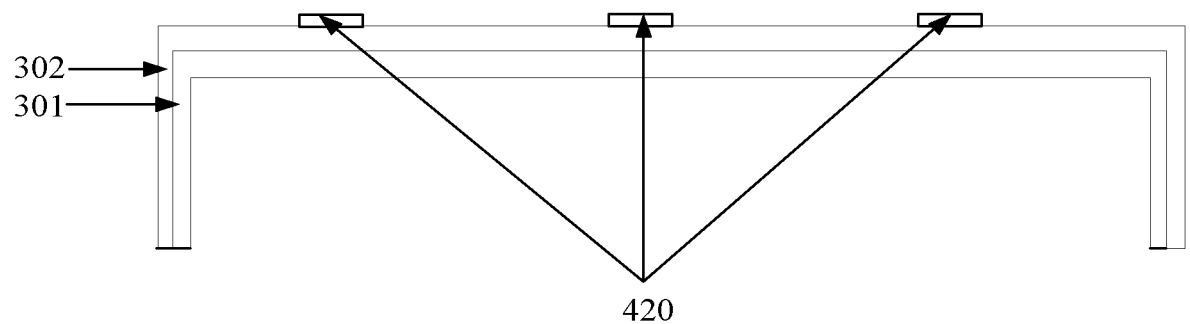
Figures 3, 6:
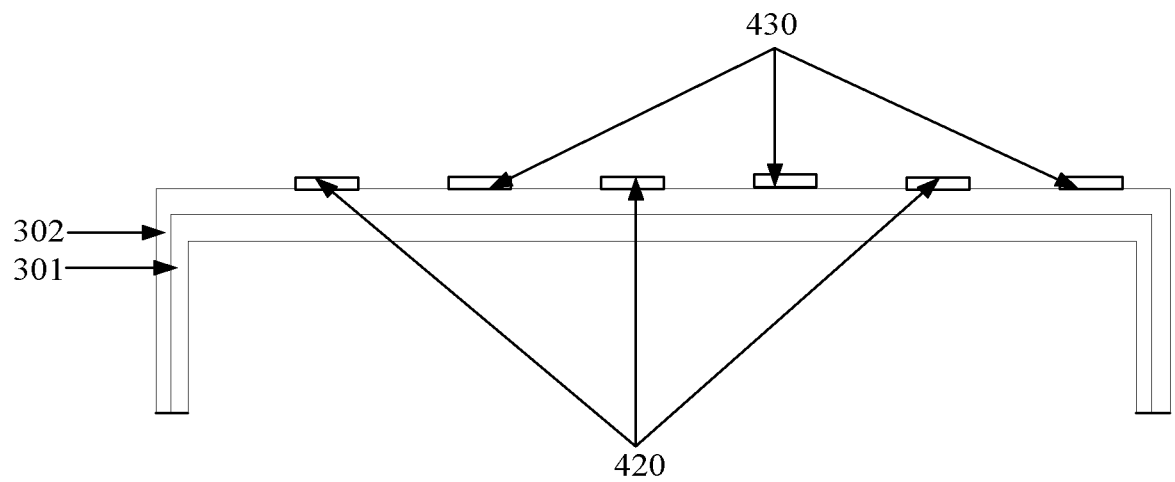
Figures 4, 6:
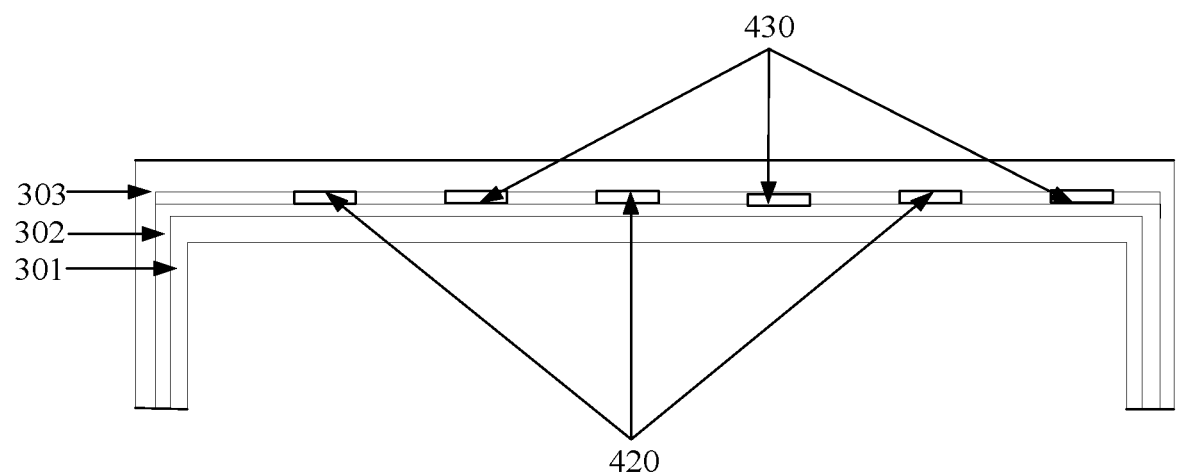
Figures 5, 6:
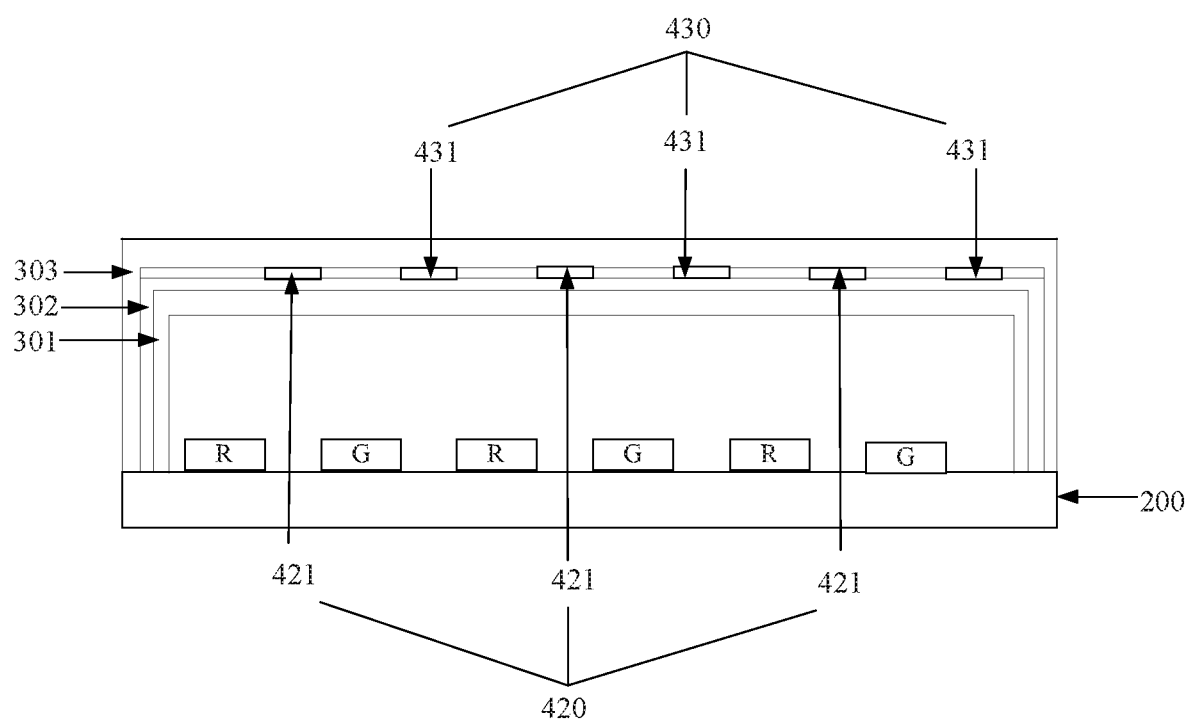

As shown in FIG. 5-6, the package substrate 300 configured with the photosensitive device 400 is adhered to the array substrate 200 to form the display assembly.

The array substrate 200 includes a pixel unit for emitting light to an object to be recognized on the displaying side of the display assembly. The photosensitive device is used for generating an optical signal based on the received light reflected by the object to be recognized and converting the generated optical light into an electric signal for recognizing the object to be recognized.

In exemplary embodiments, the pixel unit can include a plurality of pixels, each of which includes at least two sub-pixels. For example, each pixel can include three sub-pixels, that is, R sub-pixel, B sub-pixel, and G sub-pixel.

In exemplary embodiments, shown in FIG. 5-4, the photosensitive device 400 may include a plurality of photosensitive modules 410. Accordingly, the step 503 may include providing a plurality of photosensitive modules 410 on the first inorganic package layer 301 formed with the organic package layer 302, so as to allow the orthographic projection of each photosensitive module 410 on the array substrate 200 to be located in the space between two sub-pixels. For example, a plurality of photosensitive modules can be formed on the package substrate by one-time patterning process.

In step 506, a touch panel, an polarizer, an optically clear adhesive, and a cover plate are sequentially formed on the side of the package substrate away from the array substrate.

As shown in FIG. 2-1, the touch panel 001, POL 002, OCA 003, and the cover plate 004 are sequentially formed on the side of the package substrate 300 away from the array substrate 200. In some embodiments, traditional technologies may be used to implement the process of forming the touch panel, POL, OCA and the cover plate.

In the present disclosure, the photosensitive device, which is disposed on the package substrate, may generate an optical signal based on the received light reflected by the object to be recognized and convert the generated optical signal into an electric signal for recognizing the object to be recognized Compared with the related art, the photosensitive device does not tend to generate parasitic capacitance with wires in the display area of the array substrate, thereby improving the display effect of the display assembly.

FIG. 6-1 shows a flow chart of a manufacturing method for a display assembly according to an embodiment of the present disclosure. As shown in FIG. 6-1, the method may include steps 601-607.

In step 601, a first inorganic package layer is formed.

As shown in FIG. 6-2, the first inorganic package layer 301 is formed.

In step 602, an organic package layer is formed on the first inorganic package layer.

As shown in FIG. 6-3, the organic package layer 302 is formed on the first inorganic package layer 301.

In step 603, an invisible light photosensitive device is provided on the first inorganic package layer formed with the organic package layer.

As shown in FIGS. 6-2 and 6-3, the invisible light photosensitive device 420 is provided on the first inorganic package layer 301 formed with the organic package layer 302, for example, by one-time patterning process.

In step 604, a visible light photosensitive device is provided on the side of the organic package layer formed with the invisible light photosensitive device. The orthographic projections of the visible light photosensitive device and the invisible light photosensitive device on the array substrate do not overlap each other.

As shown in FIG. 6-3, the visible light photosensitive device 430 is provided on the side of the organic package layer 302 formed with the invisible light photosensitive device 420, for example, by one-time patterning process, so as to allow the orthographic projections of the visible light photosensitive device 430 and the invisible light photosensitive device 420 on the array substrate not to overlap each other. The one-time patterning process comprises the steps of photoresist coating, exposure, development, etching, and photoresist stripping.

In step 605, a second inorganic package layer is provided on the organic package layer formed with the invisible light photosensitive device and the visible light photosensitive device.

As shown in FIG. 6-4, the second inorganic package layer 303 is provided on the first inorganic package layer 301 formed with the invisible light photosensitive device 420 and the visible light photosensitive device 430.

In step 606, the package substrate configured with the invisible light photosensitive device and the visible light photosensitive device is adhered to the array substrate, so as to form the display assembly.

As shown in FIG. 6-5, the package substrate configured with the invisible light photosensitive device 420 and the visible light photosensitive device 430 is adhered to the array substrate 200, so as to form the display assembly.

The array substrate 200 includes a pixel unit for emitting light, which includes invisible light and visible light, to an object to be recognized on the displaying side of the display assembly. The invisible light photosensitive device 420 is used for generating a first optical signal based on the received invisible light reflected by the object to be recognized and converting the generated first optical signal into a first electric signal for recognizing the object to be recognized. The visible light photosensitive device 430 is used for generating a second optical signal based on the received visible light reflected by the object to be recognized and converting the generated second optical signal into a second electric signal for recognizing the object to be recognized.

In exemplary embodiments, the pixel unit includes a plurality of pixels arranged in a matrix, each of which includes at least two sub-pixels. For example, each pixel can include three sub-pixels, that is, R sub-pixel, B sub-pixel, and G sub-pixel.

As shown in FIG. 6-5, the invisible light photosensitive device 420 may include a plurality of invisible light photosensitive modules 421. Accordingly, the step 603 may include providing a plurality of invisible light photosensitive modules 421 on the first inorganic package layer 301 formed with the organic package layer 302, for example, by one-time patterning process, so as to allow the orthographic projection of each invisible light photosensitive module 421 on the array substrate 200 to be located in the space between two sub-pixels.

In exemplary embodiments, as shown in FIG. 6-5, the visible light photosensitive device 430 includes a plurality of visible light photosensitive modules 431. Accordingly, the step 604 may include providing a plurality of visible light photosensitive modules 431 on the side of the organic package layer 302 formed with the invisible light photosensitive device 420, for example, by one-time patterning process, so as to allow the orthographic projection of each visible light photosensitive module 431 on the array substrate 200 to be located in the space between two sub-pixels. Furthermore, the invisible light photosensitive module 421 and the visible light photosensitive module 431 are arranged alternately.

According to this embodiment of the present invention, the orthographic projections of the invisible light photosensitive module and the visible light photosensitive module are located in the space between two sub-pixels, so that the display effect of the display apparatus may not be affected by the photosensitive device.

In step 607, a touch panel, a polarizer, an optically clear adhesive, and a cover plate are sequentially formed on the side of the package substrate away from the array substrate.

Similar to what is shown in FIG. 3-1, the touch panel 001, the polarizer 002, the optically clear adhesive 003, and the cover plate 004 are sequentially formed on the side of the package substrate 300 away from the array substrate 200.

In the present disclosure, since the invisible light photosensitive device and the visible light photosensitive device are disposed on the package substrate, the invisible light photosensitive device may generate the first optical signal based on the received invisible light reflected by the object to be recognized, and convert the generated first optical signal into the first electric signal for recognizing the object to be recognized. At the same time, the visible light photosensitive device may generate the second optical signal based on the received visible light reflected by the object to be recognized, and convert the generated second optical signal into the second electric signal for recognizing the object to be recognized Compared with the related art, the invisible light photosensitive device and the visible light photosensitive device do not tend to generate parasitic capacitance with wires in the display area of the array substrate, thereby improving the display effect of the display assembly. Additionally, since invisible light is susceptible to the external environment, the recognition accuracy can be improved by emitting visible light through the pixel unit disposed on the array substrate.

It should be noted that the sequence of the steps of the manufacturing methods for the display assembly according to the embodiments of the present invention may be appropriately adjusted, and the steps may be correspondingly added or omitted in view of different situations. All the variations of the methods that can be readily conceived by those ordinary skilled in the art based on the technical solutions disclosed herein should be involved within the scope of the present invention, and therefore will not be described in detail herein.

By considering the specification and implementing the technical solutions disclosed herein, other embodiments of the present invention will be apparent to those skilled in the art. This application is intended to cover any variations, uses, or adaptations of the present invention, which are in accordance with the general principles of the present invention and include common general knowledge or conventional technical means in the art. The specification and embodiments should be regarded as illustrative only, and the true scope and spirit of the present invention is limited by the following claims.

It should be understood that the invention is not limited to the structures described above and illustrated in the drawings, and various modifications and changes can be made without departing from the scope of the present invention, which is limited only by appended claims.

What is claimed is:

1. A display assembly, comprising:
an array substrate;
a package substrate adhered to the array substrate; and
a photosensitive device;
wherein the array substrate includes a pixel unit for emitting light to an object to be recognized on a displaying side of the display assembly;
the photosensitive device is provided on the package substrate for generating an optical signal based on received light reflected by the object to be recognized and converting the generated optical signal into an electric signal for recognizing the object to be recognized,
wherein the pixel unit includes a plurality of pixels arranged in a matrix, each of the pixels includes at least two sub-pixels, and the photosensitive device includes a plurality of photosensitive modules, orthographic projections of the photosensitive modules being located in a space between the two sub-pixels on the array substrate.

2. The display assembly according to claim 1, wherein the package substrate includes a first inorganic package layer, an organic package layer, and a second inorganic package layer laminated sequentially, and the photosensitive device is configured between the organic package layer and the second inorganic package layer.

3. The display assembly according to claim 1, wherein the photosensitive device includes at least one of a visible light photosensitive device and an invisible light photosensitive device.

4. The display assembly according to claim 1, wherein each of the pixels includes a red sub-pixel for emitting light to the object to be recognized.

5. The display assembly according to claim 1, wherein the display assembly further includes a touch panel, a polarizer, an optically clear adhesive, and a cover plate sequentially disposed on a side of the package substrate away from the array substrate.

6. The display assembly according to claim 1, wherein the object to be recognized is a fingerprint or a palm print.

7. A manufacturing method for a display assembly, comprising:
providing a photosensitive device on a package substrate; and
adhering the package substrate configured with the photosensitive device to an array substrate to form a display assembly;
wherein the array substrate includes a pixel unit for emitting light to an object to be recognized on a displaying side of the display assembly, and the photosensitive device is configured to generate an optical signal based on received light reflected by the object to be recognized and convert the generated optical light into an electric signal for recognizing the object to be recognized, wherein the pixel unit includes a plurality of pixels arranged in a matrix, each of the pixels includes at least two sub-pixels, and the photosensitive device includes a plurality of photosensitive modules, orthographic projections of the photosensitive modules being located in a space between the two sub-pixels on the array substrate.

8. The manufacturing method according to claim 7, wherein the providing the photosensitive device on the package substrate comprises:

forming a first inorganic package layer;

forming an organic package layer on the first inorganic package layer;

providing the photosensitive device on the first inorganic package layer formed with the organic package layer; and forming a second inorganic package layer on the first inorganic package layer configured with the photosensitive device.

9. The manufacturing method according to claim 7, further comprising:

forming a touch panel, a polarizer, an optical clear adhesive, and a cover plate sequentially on a side of the package substrate away from the array substrate.

10. A display apparatus including the display assembly according to claim 1.

* * * * *